(12) United States Patent
Asam et al.

(10) Patent No.: US 11,843,238 B2
(45) Date of Patent: Dec. 12, 2023

(54) SMART ELECTRONIC SWITCH

(71) Applicant: Infineon Technologies AG, Neubiberg (DE)

(72) Inventors: Michael Asam, Sainbach (DE); Mirko Bernardoni, Villach (AT); David Jacquinod, La Fare les oliviers (FR); Louis Janinet, Le Puy Sainte Réparade (FR); Andre Mourrier, Manosque (FR)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/451,414

(22) Filed: Oct. 19, 2021

(65) Prior Publication Data

US 2022/0140594 A1    May 5, 2022

(30) Foreign Application Priority Data

Oct. 30, 2020   (DE) .......................... 102020128636.8

(51) Int. Cl.
  *H02H 3/08*  (2006.01)
  *H02H 9/02*  (2006.01)
  *H03K 5/24*  (2006.01)
  *H02H 1/00*  (2006.01)

(52) U.S. Cl.
  CPC ............ *H02H 3/08* (2013.01); *H02H 1/0007* (2013.01); *H03K 5/24* (2013.01)

(58) Field of Classification Search
  CPC ............ H02H 3/08; H02H 1/0007; H03K 5/24
  USPC ....................................................... 361/93.1
  See application file for complete search history.

(56) References Cited

U.S. PATENT DOCUMENTS

| | | | |
|---|---|---|---|
| 3,300,685 A * | 1/1967 | Zocholl | ................... H02H 6/00 361/94 |
| 2011/0295529 A1 | 12/2011 | Vanhala et al. | |
| 2013/0082627 A1 * | 4/2013 | Ichikawa | ................. H02P 6/00 318/139 |
| 2018/0191147 A1 | 7/2018 | Graf | |

FOREIGN PATENT DOCUMENTS

DE      102017131359 A1    7/2018

\* cited by examiner

*Primary Examiner* — Jared Fureman
*Assistant Examiner* — Lucy M Thomas
(74) *Attorney, Agent, or Firm* — Slater Matsil, LLP

(57) ABSTRACT

According to an embodiment, a current monitoring circuit includes a signal shaping unit configured to receive a current sense signal and provide a modified current signal; a filter configured to receive the modified current signal and to provide a respective filtered signal; a comparator configured to receive the filtered signal and a threshold value and to indicate when the filtered signal exceeds the threshold value. The signal shaping unit is configured to calculate a level of the modified current signal from a corresponding level of the current sense signal in accordance with non-linear function.

14 Claims, 7 Drawing Sheets

SMART ELECTRONIC SWITCH

This application claims the benefit of German Patent Application No. 102020128636.8, filed on Oct. 30, 2020, which application is hereby incorporated herein by reference.

TECHNICAL FIELD

The present disclosure relates to the field of smart semiconductor switches.

BACKGROUND

Almost every electric installation (e.g., in an automobile, in a house, electric subsystems of larger installations) includes one or more fuses to provide over-current protection. Standard fuses include a piece of wire that provides a low-ohmic current path in case the current passing through the fuse is below a nominal current. However, the piece of wire is designed to heat up and melt or vaporize when the current passing through the fuse exceeds the nominal current for a specific time. Once triggered, a fuse must be replaced by a new one.

Fuses are being increasingly replaced by circuit breakers. A circuit breaker is an automatically operated electrical switch designed to protect an electrical circuit from damage caused by overcurrent, overload or short-circuit. Circuit breakers may include electro-mechanical relays which are triggered to disconnect the protected circuit from the supply when an over-current (i.e., a current exceeding the nominal current) is detected. In many applications (e.g., in the on-board power supply of an automobile), circuit breakers may be implemented using an electronic switch (e.g., a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually the switching state (on/off) of electronic switches such as MOS transistors is controlled using so-called driver circuits or simply drivers (gate drivers in case of MOS transistors).

Usually, conventional fuses—and electronic fuses—are designed for a (hypothetical) constant electric load that produces a specific thermal load on the cable. That is, the constant electric load results in a specific cable temperature increase above ambient temperature. The purpose of the fuse is to ensure that the thermal load on the cable stays within a defined limit. Therefore, known electronic fuse circuits are designed to emulate the time-current characteristic of a cable that supplies the load (which defines for how long a specific current level may flow through the electronic fuse before the fuse triggers the disconnection of the load). However, in many applications the load changes dynamically. In view of the fact that the thermal time constant of commonly used cables is in the range of a few minutes (e.g., 90 seconds in some applications) the activation of an electric load for, e.g., 30 seconds, may be a highly dynamic process as compared to the thermal time constant of the cable.

SUMMARY

A current monitoring circuit is described herein. In accordance with one embodiment, the current monitoring circuit includes two or more signal branches, each of which includes: a signal shaping unit configured to receive a current sense signal and provide a modified current signal; a filter configured to receive the modified current signal and to provide a respective filtered signal; a comparator configured to receive the filtered signal and a respective threshold value and to provide a respective logic signal that signals when the filtered signal exceeds the threshold value; and a logic circuit configured to combine the logic signals of the two or more signal branches. The signal shaping unit of each signal branch is configured to calculate a level of the respective modified current signal from a corresponding level of the current sense signal in accordance with a non-linear function.

According to another embodiment, the current monitoring circuit includes a signal shaping unit configured to receive a current sense signal and provide a modified current signal; a filter configured to receive the modified current signal and to provide a respective filtered signal; a comparator configured to receive the filtered signal and a threshold value and to signal when the filtered signal exceeds the threshold value. The signal shaping unit is configured to calculate a level of the modified current signal from a corresponding level of the current sense signal in accordance with a look-up table or in accordance with a function that is a polynomial function with an order higher than two or a piecewise-linear function.

A further embodiment relates to a current monitoring method. Accordingly, the method includes reshaping a current sense signal—using a signal shaping unit—to provide a modified current signal; filtering—using a digital filter—the modified current signal to provide a respective filtered signal; comparing the filtered signal and a digital threshold value and signaling when the filtered signal exceeds the digital threshold value. The signal shaping unit calculates a level of the modified current signal from a corresponding level of the current sense signal in accordance with a look-up table or in accordance with a function that is a polynomial function with an order higher than two or a piecewise-linear function.

BRIEF DESCRIPTION OF THE DRAWINGS

The embodiments described below can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

In the following detailed description, reference is made to the accompanying drawings. The drawings form part of the description and, for the purpose of illustration, show examples of how the invention can be used and implemented. It is to be understood that the features of the various embodiments described herein may be combined with each other, unless specifically noted otherwise. Further, although the examples described herein are directed to electronic fuse circuit, the embodiments are not limited to applications related to electronic fuses.

Figure 1:
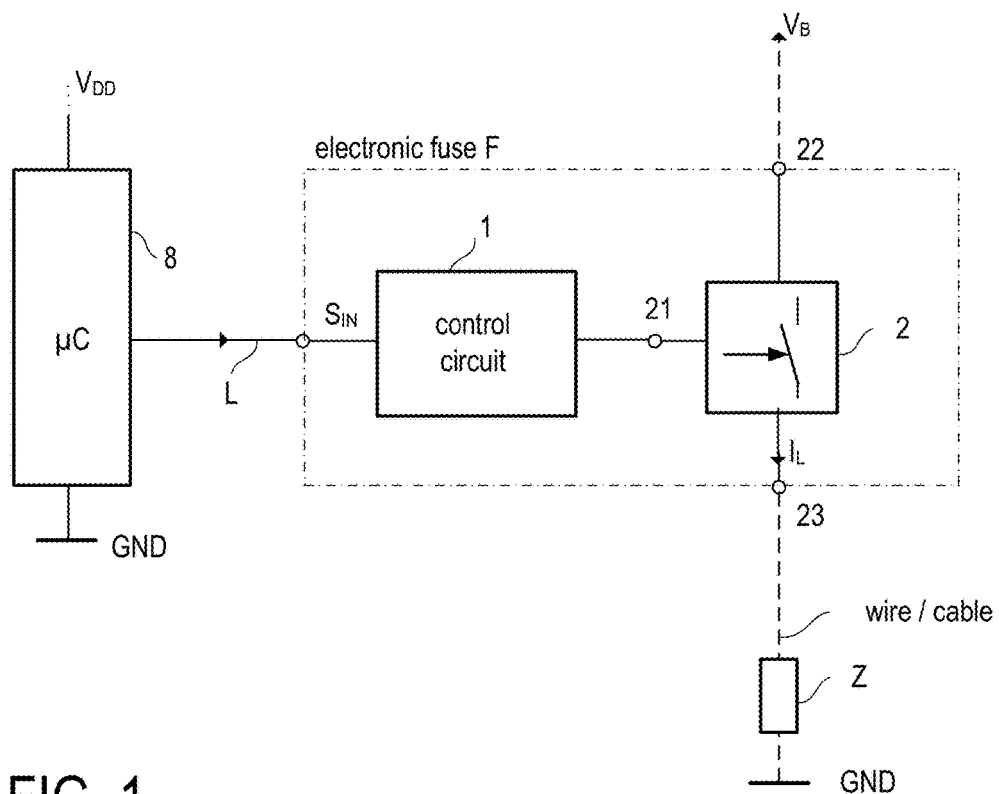
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit that can be operated as an electronic fuse. Therefore, the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated in one semiconductor die (chip) or may be integrated in separate semiconductor dies that are arranged in one integrated circuit package. Alternatively, gate driver and MOSFET may be integrated in separate chips. The electronic fuse circuit F is configured to drive a load Z (the wires connecting the load are illustrated in dashed lines in FIG. 1), which can be connected in series with the load current path of the electronic switch 2. Thus, the series circuit of the load current path of the electronic switch 2 and load Z can be connected between supply nodes, at which a first supply potential and a second supply potential can be provided. The second supply potential is usually referred to as ground potential GND (e.g. zero volts). In the following, a voltage between the two supply nodes is referred to as supply voltage $V_B$. The load current $i_L$ passing through the load Z can be switched on and off in accordance with an input signal $S_{IN}$ supplied to the control circuit 1, for example, by a microcontroller 8. However, dependent on the application, the input signal $S_{IN}$ can also be generated by any other circuitry instead of a micro controller.

In an exemplary application, the electronic fuse circuit F may be used to drive a load Z in an automobile. In this case, the power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. The load Z may also represent an electric subsystem (including a plurality of individual electric loads) of the electric installation of an automobile. In the example of FIG. 1, the electronic switch 2 and the load Z are connected in a high-side configuration. That is, the load Z is connected between the electronic switch 2 and the ground node GND. This, however, is only an example. The electronic switch 2 and the load Z can also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g., included in a cable). Dependent on where the electronic circuit and the respective load Z are located in the electric installation of an automobile, the wire may have a considerable length of several 10 cm or even significantly more (e.g., up to 10 m). A modern automobile includes a plurality of electric loads, so that a plurality of wires are required to connect the individual loads to their respective electronic switches. In order to save costs and resources, it may be desirable to dimension the individual wires such that, in the long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an "overload situation" is detected. An overload situation is a situation that may result in the wire or the load being damaged or destroyed if the electronic switch 2 is not switched off (within a specific time) to disconnect the wire (and the load Z) from the power source that provides the supply voltage $V_B$ (e.g., the automobile battery). This mechanism is explained in further detail below. As the electronic fuse circuit F is configured to switch on and off the load Z and to protect the wire, it is also referred to as switching and protection circuit in the following.

In the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state in which the electronic switch 2 is capable of conducting a current between the first load node 22 and the second load node 23.

"Switched off" means that the electronic switch 2 is operated in an off-state in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it may also be possible for the functions of the individual functional blocks to be (at least in part) performed by a programmable circuit (e.g., a processor) that is configured to execute software/firmware stored in a memory.

Figure 2:
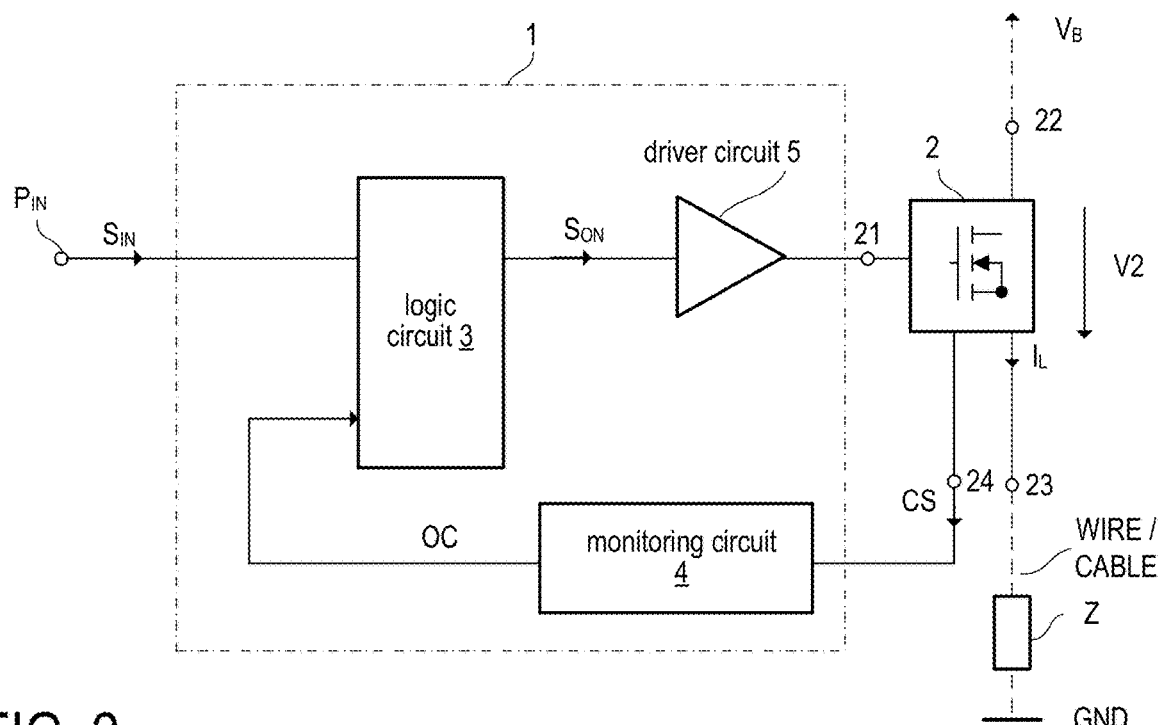
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a time-current characteristic of the load current $i_L$. The expression "to generate the first protection signal OC based on the time-current characteristic of the load current" may include that the monitoring circuit 4 processes a signal representing the instantaneous current amplitude of the load current $i_L$ as well as previous current amplitudes to generate the first protection signal OC. That is, the monitoring circuit 4 evaluates a load current $i_L$ over a certain time period in order to generate the first protection signal OC. In order to be able to evaluate the load current $i_L$, the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be (at least partially) integrated in the electronic switch 2. However, this is only an example. A current measurement circuit separate from the electronic switch 2 may be used as well. Various current sense circuits (e.g., shunt resistors, Sense-FET circuits, etc.) are known and are thus not further explained herein in detail.

The control circuit 1 illustrated in FIG. 2 is configured to drive the electronic switch 2 based on the protection signal OC and an input signal $S_{IN}$ received at a first input node (e.g., input pin) $P_{IN}$ of the electronic fuse circuit F. The protection signal OC, as well as the input signal $S_{IN}$, are supplied to a logic circuit 3, which generates a drive signal $S_{ON}$ based on the protection signal OC and the input signal $S_{IN}$. The drive signal $S_{ON}$ is directly or indirectly (e.g., via diver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor such as a MOSFET (as schematically illustrated in FIG. 2). A MOSFET is a voltage-controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
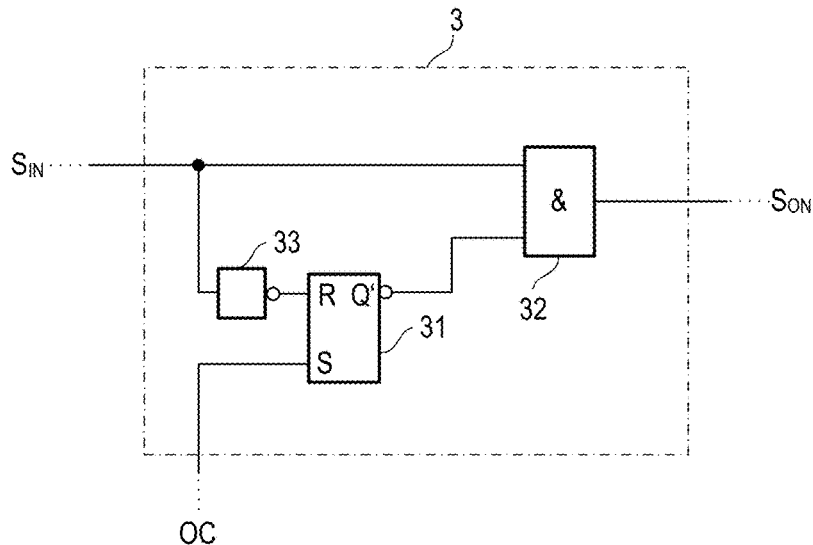
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes an inverter 33, an SR latch 31 (flip-flop) and an AND gate 32. A first input of the AND gate 32 is configured to receive the input signal $S_{IN}$, whereas a reset input R of the SR latch 31 is configured to receive the inverted input signal provided by inverter 33. The set input S of the SR latch 31 is configured to receive the protection signal OC. The inverting output Q' of the SR latch 31 is connected with a second input of the AND gate 32. The drive signal $S_{ON}$ is provided at the output of the AND gate 32.

Figure 4:
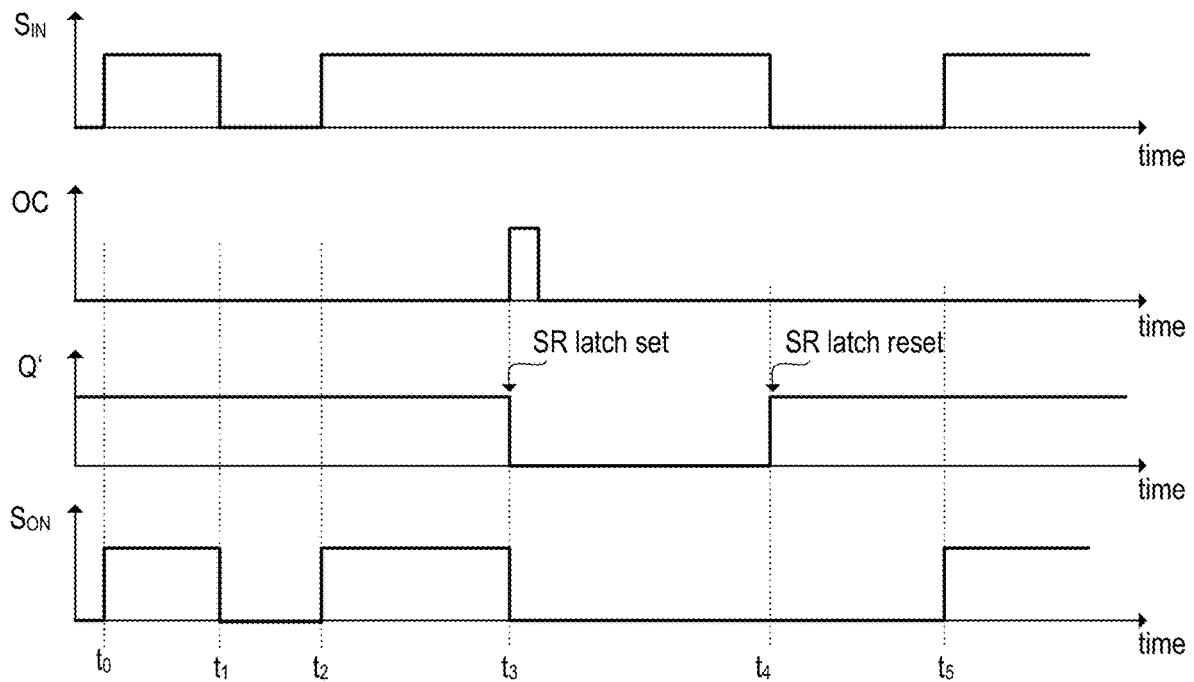
FIG. 4 shows timing diagrams illustrating the function of the control circuit shown in FIG. 2.

The function of the logic circuit 3 is further illustrated in the timing diagrams of FIG. 4. The initial low level of input signal $S_{IN}$ causes a reset of the SR latch 31, which results in a high level at the inverting output Q' of the SR latch 31. Accordingly, both inputs of the AND gate 32 "see" a high level, and the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input and the output of the AND gate 32 provides the drive signal $S_{ON}$ with a low-level (which causes a switch off of the power transistor 2). In other words, the input signal $S_{IN}$ is fed through the logic circuit 3 (i.e., the drive signal $S_{ON}$ equals the input signal $S_{IN}$) provided that the SR latch 31 is in its reset state. Once the SR latch 31 is set in response to the protection signal OC changing to a high-level, the inverting output Q' of the SR latch 31 is set to a low level (see FIG. 4, time instant $t_3$). Accordingly, the AND gate 32 sees a low level at its second input and the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2 and a reset of SR latch 31, see FIG. 4, time instant $t_4$) and again to a high level (indicating a switch-on of the electronic switch 2, see FIG. 4, time instant $t_5$). It is again noted that the function of the exemplary implementation of FIG. 3 may be implemented in various other ways as well. Further, it is noted that in other embodiments the reset of the SR latch 31 may be triggered in a different way. For example, the microcontroller 8 (see FIG. 1) may provide a dedicated reset signal.

Figure 5A:
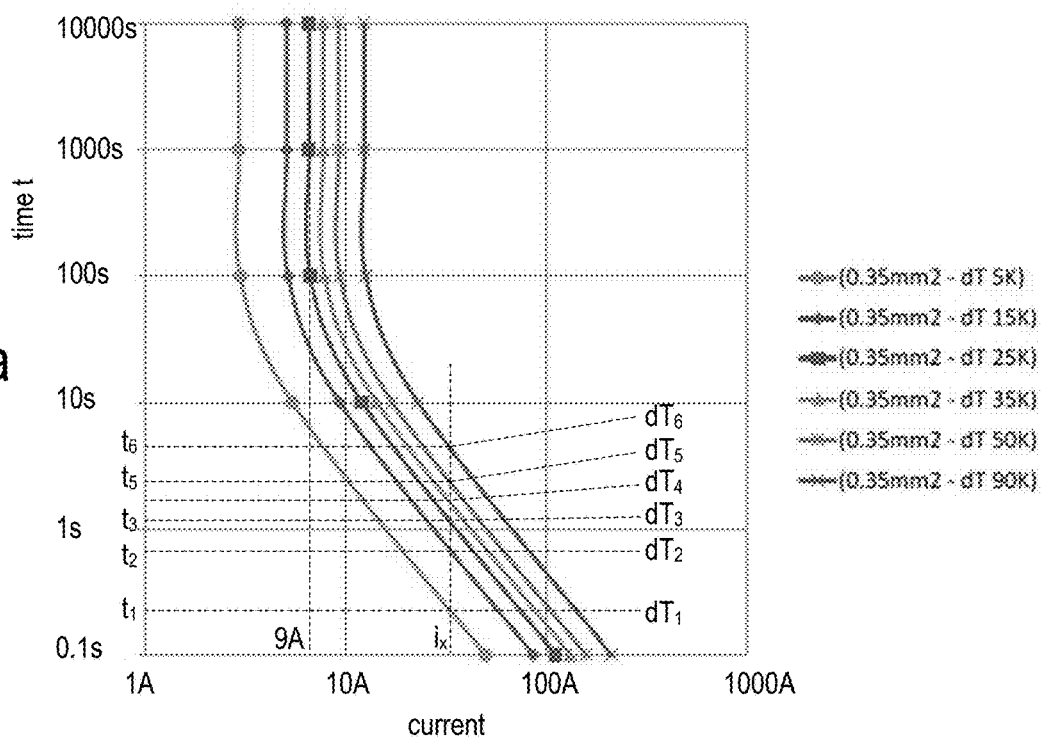
FIG. 5a is a diagram illustrating a family of characteristic curves (time over current) for a 0.35 mm2 cable and for different maximum cable temperatures.
Figure 5B:
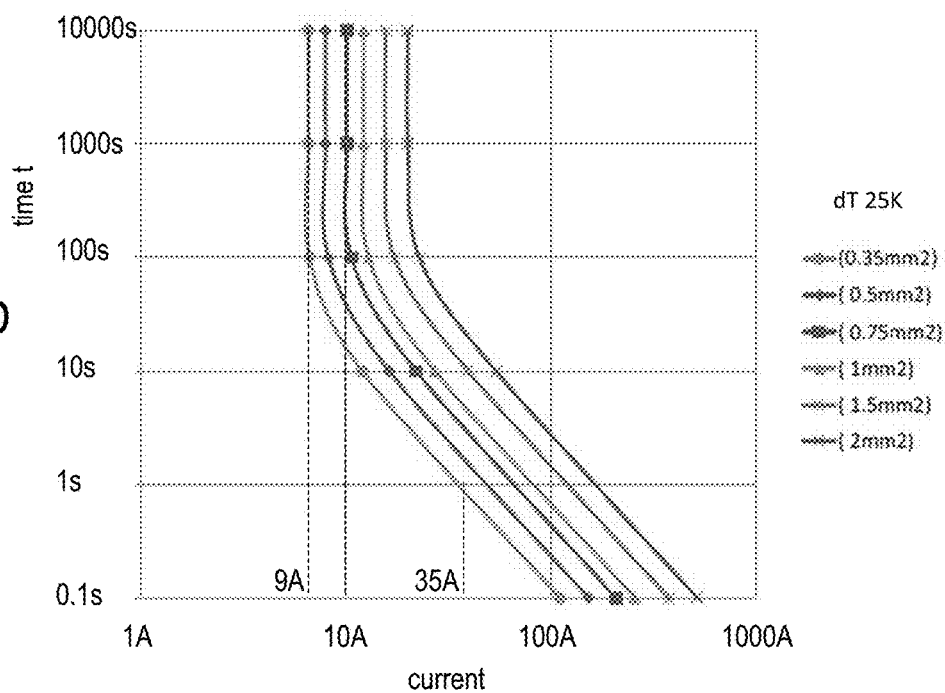
FIG. 5b is a diagram illustrating a family of characteristic curves (time over current) for a maximum cable temperature of 25 Kelvin above ambient temperature and for different cable cross-sections.

As mentioned above, the wire connecting load Z and electronic fuse circuit F can be designed to withstand a nominal current of the load Z. The lifetime of a wire (or a cable) depends on the wire temperature. FIGS. 5A and 5B are diagrams showing a family of characteristic curves (each representing a specific time-current characteristics), wherein each characteristic curve is associated with a specific combination of maximum temperature difference dT (maximum temperature above ambient temperature) and cable cross section (e.g., cross-sectional area in $mm^2$). Each characteristic curve can be regarded as an "isotherm" (line of equal temperature dT) and represents the relation between the current and the maximum allowable time period that the wire can carry the current without exceeding the specified temperature difference dT.

FIG. 5A shows characteristic curves for various temperature differences dT and a specific cross sectional area of 0.35 mm², while FIG. 5B shows characteristic curves for a specific temperature difference dT of 25 K (Kelvin) and various cross sectional areas. As can be seen from FIGS. 5A and 5B, a wire with a cross-sectional area of 0.35 mm² can carry a current of approximately 9 A (amperes) for a practically infinite amount of time without exceeding a temperature difference dT of 25 K above ambient temperature. As can be seen from FIG. 5B, a wire with a cross-sectional area of 0.75 mm² can carry a current of 10 A (amperes) for approximately 100 seconds or 35 A for approximately 1 second before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

Figure 6:
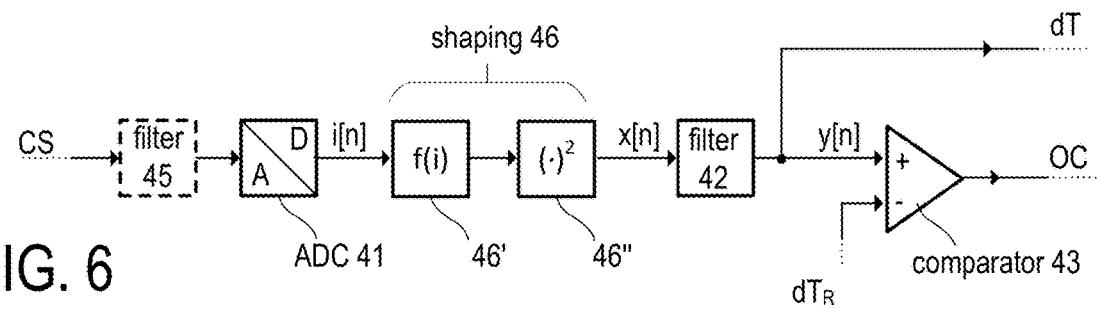
FIG. 6 illustrates one example of the monitoring circuit used in the example of FIG. 2; the monitoring circuit includes a filter and a comparator, wherein the filter time constant, the shaping function and the comparator threshold determine the time-current-characteristic of the monitoring circuit.

As can be seen from FIGS. 5A and 5B, a temperature difference $dT_x$ (e.g., temperature values $dT_1$, $dT_2$, $dT_3$, $dT_4$, $dT_5$, $dT_6$) is associated with a given integration time $t_x$ (e.g., times $t_1$, $t_2$, $t_3$, $t_4$, $t_5$, $t_6$) for a given current (see FIG. 5A, current $i_x$) and a specific cross-sectional area (e.g., 0.35 mm² in the example of FIG. 5A). Hence, a temperature value dT (representing the temperature above ambient temperature) can be determined for a specific wire cross section by integrating the power resulting from a load current $i_L=i_x$ passing through the wire over time. The first protection signal OC may indicate a switch-off of the electronic switch 2 when the temperature value dT reaches a defined first reference temperature difference $dT_R$. The mentioned integration can be efficiently implemented using a digital filter, which may be included in the monitoring circuit 4 (see FIG. 2). One exemplary implementation of a monitoring circuit is illustrated in FIG. 6. In the embodiments described herein, the digital filter is a low-pass filter. In one embodiment, the low-pass filter is a first order filter, which is sufficient when using a simple thermal model of the cable (based on Fourier's law).

Basically, the monitoring circuit of FIG. 6 is configured to determine the first protection signal OC based on the current sense signal CS. As mentioned, the integration can be carried out in a digital filter 42, which has an integrating characteristic (implemented by a low-pass filter). According to the depicted example, the current sense signal CS, which may be a voltage that is proportional to the load current $i_L$, is supplied to the input of filter 45, which may be an (optional) analog low-pass filter, to remove transients or the like that have a comparably high frequency. The output of filter 45 may be connected to the input of analog-to-digital converter (ADC) 41, which is configured to digitize the filtered current sense signal CS. The digital current sense signal i[n] is then reshaped by the signal shaping unit 46. Commonly, the shaping circuit 46 is configured to square (see block 46" in FIG. 6) the digital current signal i[n]. The resulting reshaped signal is denoted as x[n]. In addition or alternatively to the squaring, the signal shaping unit 46 may perform any other non-linear transformation of the digital current signal i[n] (see block 46' in FIG. 6). The reshaped current signal x[n] is supplied to the filter 42 which may be a low-pass filter. In case the signal shaping unit 46 basically performs a squaring, the reshaped current signal x[n] is indicative of the electric power and the output signal y[n] of the filter 42 may be interpreted as temperature.

The resulting temperature value y[n]=dT (representing a temperature difference above ambient temperature) is then supplied to digital comparator 43, which can be configured to set the first protection signal OC to a high-level when the temperature value dT provided at the output of digital filter 42 exceeds the first reference temperature difference $dT_R$ (e.g., 25 K) specified for a specific wire cross-section. The filter characteristic of filter 42 may be based on a thermal model of the cable or the electric load to be monitored. As mentioned, the filter characteristic may be a first order low-pass when emulating a simple thermal model.

As mentioned, the digital filter 42 is configured to convert the (e.g., squared) load current and an associated integration time, during which the current passes through the wire, into a temperature value dT. In the present example, the filter characteristic 42 depends on a parameter characterizing the wire, e.g. the cross-sectional area of the wire that carries the current, and may be represented by a family of characteristic curves such as those shown in the diagram of FIG. 5A (for an exemplary cross-sectional area of 0.35 mm²).

Figure 7:
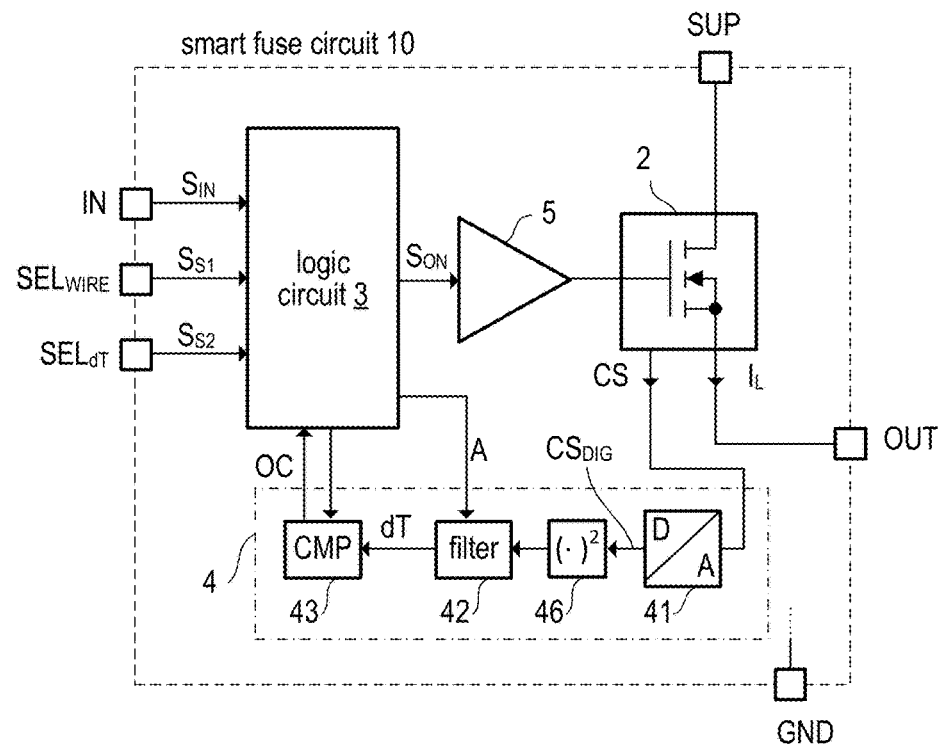
FIG. 7 illustrates a first example of an e-fuse ("smart fuse") circuit that allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated than in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example such that its characteristic can be selected based on at least one wire parameter, which allows, for example, to select a characteristic for a specific wire cross section and/or a desired reference temperature difference $dT_R$ (temperature threshold). In the examples described herein, the at least one wire parameter represents the cable cross-sectional area and/or the maximum temperature value above ambient temperature. As can be seen in the diagrams of FIG. 5, these two wire parameters define a specific characteristic curve that represents the desired behavior of the electronic fuse circuit for a specific wire/cable. It is understood that other parameters such as wire diameter or absolute temperature (e.g., in case ambient temperature is measured) can be used as wire parameters. Furthermore, a wire parameter is not necessarily representative of any physical quantity (such as cross-sectional area or temperature) but can be a mere numerical parameter that allows determining (e.g., selecting) the desired characteristic used by the monitoring circuit. In one example, the wire parameter is merely a number indicating the characteristic curve to be applied. As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7, all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which in the present example includes information about a wire cross-sectional area A and a reference temperature difference $dT_R$, from a microcontroller or other control circuitry. As illustrated in FIG. 6, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2, the monitoring circuit 4 receives an (analog) current sense signal CS and generates, based on this current sense signal CS, the first protection signal OC, which may be processed by the logic circuit 3, for example, as shown in the example of FIG. 3.

As mentioned, the filter 42 can be implemented as a first-order low-pass filter. That is, the (continuous-time) filter transfer function H(s) can be written as follows:

$$H(s) = \frac{b}{1 + s\tau} \quad (1)$$

wherein $\tau$ represents the filter time constant and b represents the filter gain. The comparator 43 triggers a switch-off of the electronic switch 2 (by generating an over-current signal OC) when the following condition is fulfilled:

$$\mathcal{L}^{-1}\left\{P(s)\frac{b}{1 + s\tau}\right\} \geq \Delta T. \quad (2)$$

Figure 10:
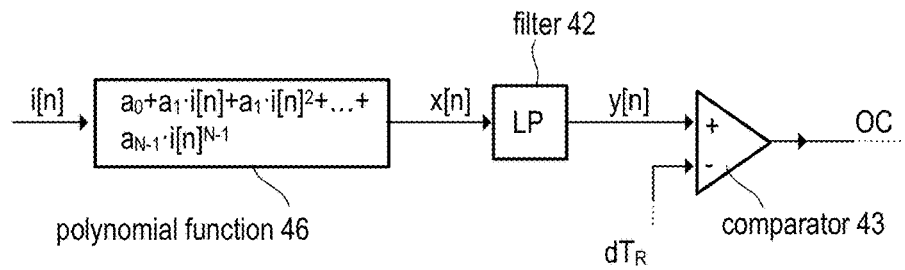
FIGS. 10 and 11 illustrate different embodiments of a current monitoring circuit that may be used in the circuit of FIG. 2.

That is, a switch-off is triggered when the estimated cable temperature, which is represented by the filter output of the filter 42, reaches or exceeds a temperature threshold $\Delta T$ (in equation 2 $\mathcal{L}^{-1}\{\bullet\}$ denotes the inverse Laplace transform). The above condition (2) can be reformulated as $$\mathcal{L}^{-1}\left\{P(s)\frac{1}{1 + s\tau}\right\} \geq dT_R, \quad (3)$$

wherein $dT_R = \Delta T/b$, and P(s) denotes the Laplace transform of the filter input signal. It is evident from conditions (2) and (3) that filter gain b and threshold value $\Delta T$ are not independent parameters. A specific reference temperature $dT_R$ can be achieved by different combinations of filter gain b and threshold value $\Delta T$. Varying the filter gain b has a similar effect as varying the temperature threshold $\Delta T$. It is understood that, although $dT_R$ represents a temperature, it is not measured in Kelvin (as can be seen in FIG. 10, $dT_R$ has the physical dimension of amperes squared).

Figure 8:
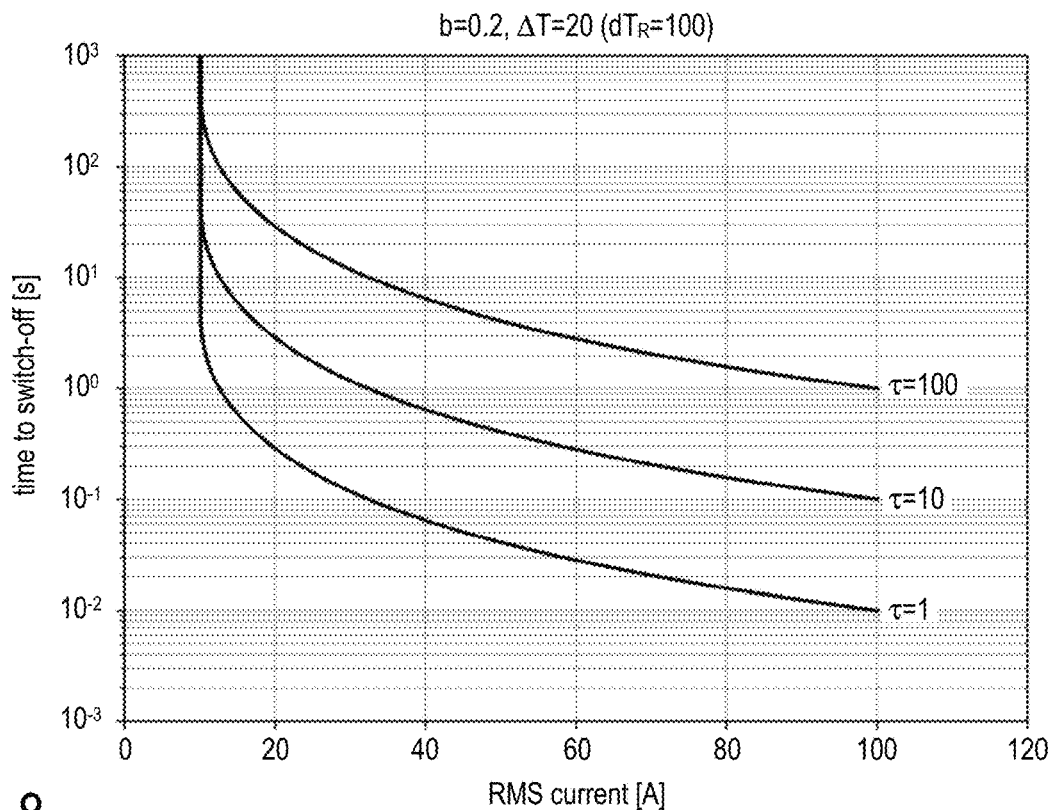
FIG. 8 is a diagram illustrating the effect of the filter time constant on the time-current characteristic in case a first order low-pass-filter is used in the monitoring circuit of FIG. 6.
Figure 9:
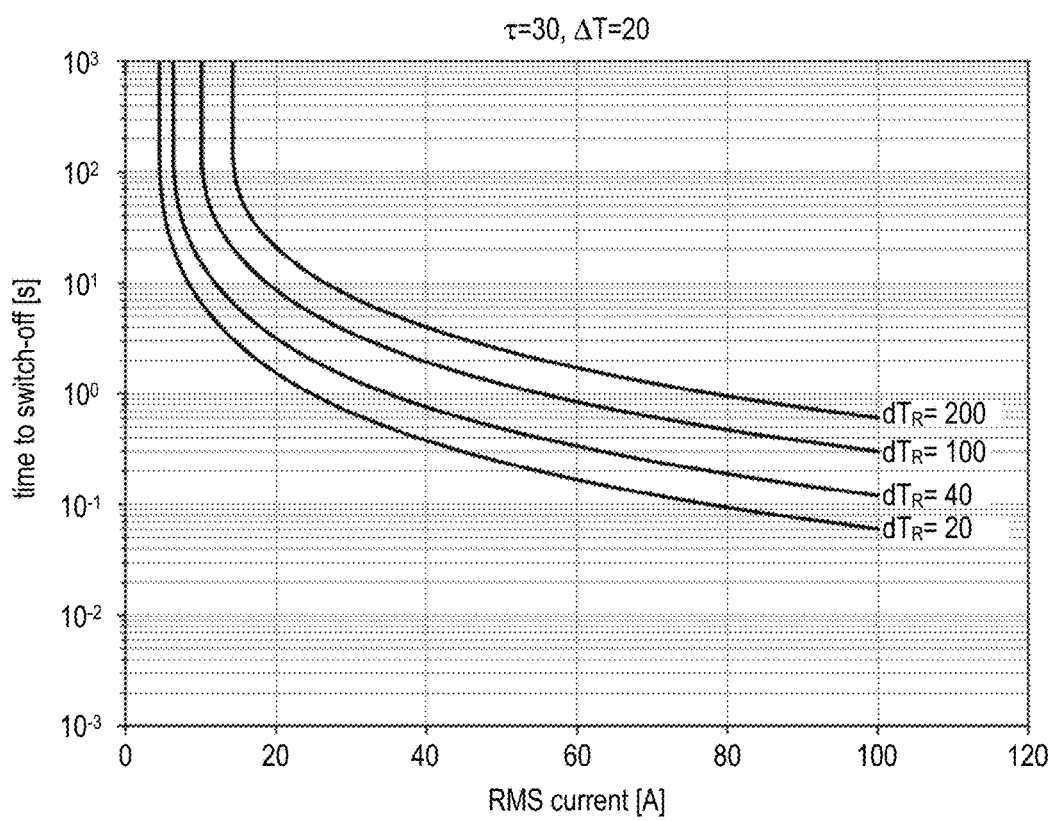
FIG. 9 is a diagram illustrating the effect of the comparator threshold on the time-current characteristic in a case in which a first order low-pass-filter is used in the monitoring circuit of FIG. 6.

FIGS. 8 and 9 illustrate the effect of varying the filter time constant t and the filter gain b on the characteristic curve (cf. FIG. 5). As shown in FIG. 8, varying the filter time constant $\tau$ results in a vertical shift of the characteristic curve due to the scaling of the time axis. In contrast, as shown in FIG. 9, varying the filter gain b results in a horizontal shift of the characteristic curve due to the scaling of the current axis. It is noted that, in the example of FIG. 9, a filter gain b=1 results in a reference temperature $dT_R$ of $\Delta T/b = 20$ $A^2$ (amperes squared, represents temperature). Similarly, a filter gain b=0.5 results in a reference temperature $dT_R$ of $\Delta T/b = 40$ $A^2$, a filter gain b=0.2 results in a reference temperature $dT_R$ of $\Delta T/b = 100$ $A^2$, and a filter gain b=0.1 results in a reference temperature $dT_R$ of $\Delta T/b = 200$ $A^2$.

It is again emphasized that instead of changing the filter gain b, the reference temperature $dT_R$ can be changed to achieve the same effect. In the further description, it is assumed (without loss of generality) that the filter gain b is constant and set to b=1, and the reference temperature $dT_R$ is adjustable to match the specification for a specific cable.

As mentioned, the filter output signal provided by the filter 42 and supplied to the comparator input of comparator 43 can be interpreted as a temperature. As can be seen from FIGS. 8 and 9, the options for selecting a specific time-current characteristic are very limited. Basically, the filter time constant t and the comparator threshold $dT_R$ determine the characteristic curve, which can be shifted vertically and horizontally by varying the parameters t and $dT_R$. However, by changing these two parameters it is not possible to change the shape of the time-current characteristic as such.

FIG. 10 illustrates one embodiment which may be regarded as a further development of the circuit of FIG. 6. Analog filters that, as the case may be, are present and the analog-to-digital converter 41 are omitted in FIG. 10 to keep the illustration simple. According to FIG. 10 the signal shaping unit 46 has a polynomial characteristic. That is, the signal shaping unit 46 is configured to calculate a level of the modified current signal x[n] from a corresponding level of the (digital) current sense signal i[n]) in accordance with a polynomial function f(i) with an order higher than two. Accordingly, the function f(i) may have the form $f(i) = a_0 + a_1 \cdot i[n] + a_2 \cdot i[n]^2 + \ldots + a_{N-1} \cdot i[n]^{N-1} + a_N \cdot i[n]^N$, wherein $a_0$, $a_1$, $a_2$, ..., $a_N$ are the coefficients of a $N^{th}$ order polynomial. Apart from the signal shaping unit, the circuit of FIG. 10 is the same as the circuit in FIG. 6 and reference is made to the respective description above.

Figure 11:
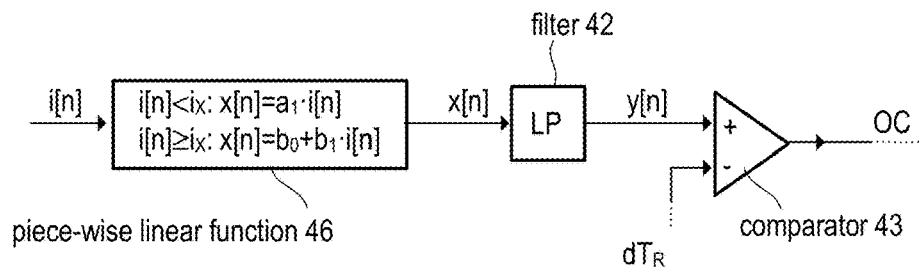

FIG. 11 illustrates another embodiment which distinguishes from the example of FIG. 10 in the implementation of the signal shaping unit 46, which transforms/reshapes the current sense signal i[n] in accordance with a piece-wise linear function in order to obtain the modified current signal x[n]. The filter 42 and the comparator 43 may be implemented as explained above with reference to the example of FIG. 6. One simple example of a piece-wise linear function is $x[n] = a_1 \cdot i[n]$ for $i[n] < i_x$, and $x[n] = b_0 + b_1 \cdot i[n]$ for $i[n] \geq i_x$, wherein $i_X$ is a current threshold, $a_1$ is a constant coefficient, $b_1$ is a further constant coefficient, and $b_0 = (a_1 - b_1) \cdot i_x$ in order to obtain a continuous piecewise linear function. This example is a piecewise function composed of two linear branches. It is understood that this concept can easily be extended to an arbitrary number of linear branches.

Figure 12:
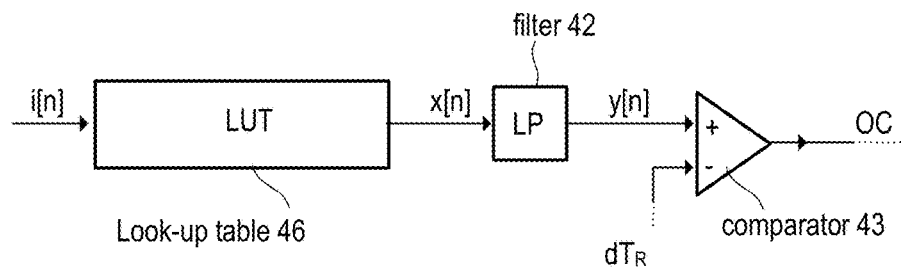
FIG. 12 illustrates a further embodiment of a current monitoring circuit that may be used in the circuit of FIG. 2, wherein the embodiment includes a look-up-table.

FIG. 12 illustrates another embodiment which distinguishes from the examples of FIGS. 10 and 11 only in the implementation of the signal shaping unit 46. Accordingly, the signal shaping unit 46 is implemented using a lookup table which allows a comparably easy implementation of an arbitrary non-linear function for transforming (reshaping) current sense signal i[n] into the modified/reshaped current signal x[n]. The filter 42 and the comparator 43 may be implemented as explained above with reference to the example of FIG. 6.

Figure 13:
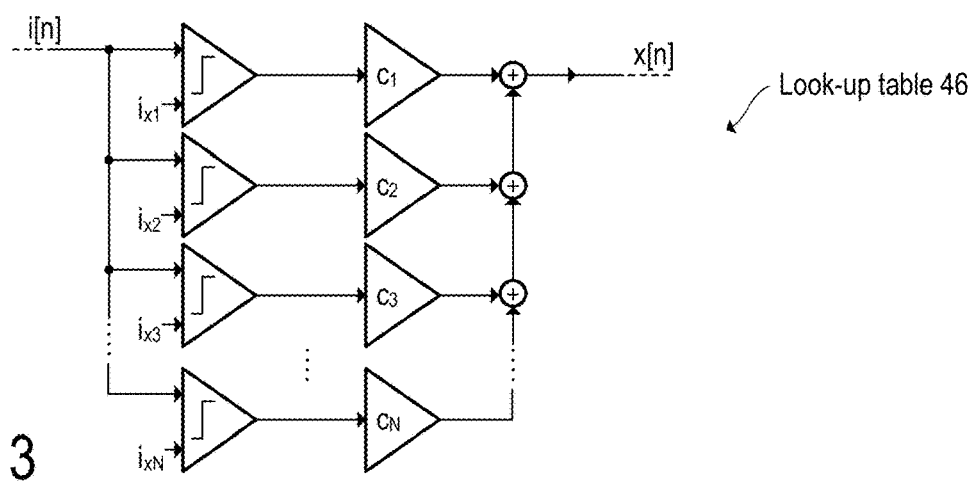
FIG. 13 illustrates one exemplary implementation of the lookup-table used in the circuit of FIG. 12.

FIG. 13 illustrates one example that is an efficient implementation of the lookup table of FIG. 12. Accordingly, the current sense signal i[n] is supplied to a plurality of comparators, each of which receiving a different current threshold value. In FIG. 12, these threshold value are denoted as $i_{x1}, i_{x2}, \ldots i_{xN}$. If the current value of the current sense signal i[n] is equal to or exceeds one or more of the threshold values $i_{x1}, i_{x2}, \ldots i_{xN}$ the respective comparator(s) generates an output value of e.g., "1" and zero otherwise. The output values ("0" or "1") of the comparators are scaled with scaling factors $c_1, c_2, \ldots, c_N$, and the scaled comparator outputs (which are either zero or equal to $c_1, c_2, \ldots,$ or, respectively, $c_N$) are summed up, to obtain the modified current signal x[n]. The comparator threshold values $i_{x1}, i_{x2}, \ldots i_{xN}$ and the scaling factors $c_1, c_2, \ldots, c_N$, are taken from a lookup table, i.e. are stored in a register or a memory. The characteristic of the signal shaping unit of FIG. 12 can also be written as $x[n]=c_1 \cdot \sigma(i[n]-i_{x1})+c_2 \cdot \alpha(i[n]-i_{x2})+ \ldots +c_N \cdot \alpha(i[n]-i_{xN})$, wherein $\sigma(i[n]-u)$ is the step function, which yields 1 for $i[n] \geq u$ and 0 otherwise.

Figure 14:
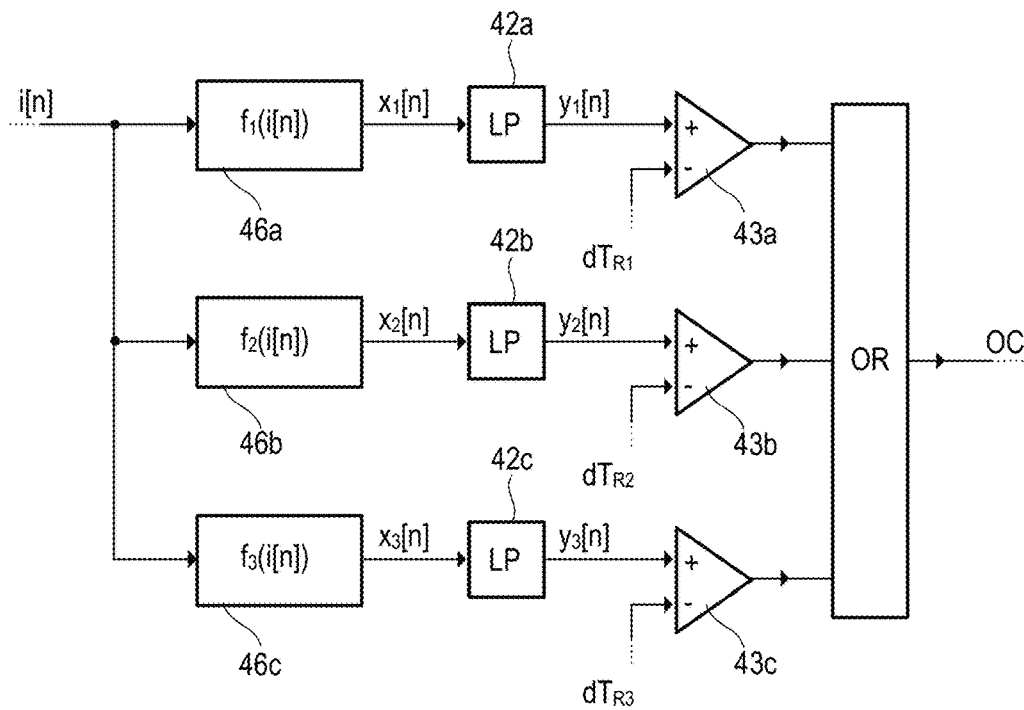
FIG. 14 illustrates a further embodiment of a current monitoring circuit, which allows a more flexible tuning of the desired time-current characteristic.

FIG. 14 illustrates a further embodiment which allows the most flexible adjustment of a desired time-current characteristic of an electronic fuse circuit. The concept illustrated in FIG. 14 combines two or more (three in the depicted example) monitoring circuits as shown, e.g. in FIGS. 10-13 into one circuit. Accordingly, the current monitoring circuit of FIG. 14 has a first branch including a first current shaping circuit 46a, a first filter 42a and a respective first comparator 43a, a second branch including a second current shaping circuit 46b, a second filter 42b and a respective second comparator 43b, and a third branch including a third current shaping circuit 46c, a third filter 42c and a respective third comparator 43c. Each branch may be constructed analogously to the circuits of FIGS. 10-13. The current shaping circuits 46a-c receive the same current sense signal i[n] (e.g., from ADC 41) and provide the modified current signals $x_1[n], x_2[n],$ and $x_3[n]$, respectively. These modified current signals $x_1[n], x_2[n],$ and $x_3[n]$ are supplied to the filters 42a-c and the resulting filtered signals $y_1[n], y_2[n],$ and $y_3[n]$ are compared to the respective threshold values $dT_{R1}, dT_{R2},$ and $dT_{R3}$ using comparators 43a-c. The filters 42a-c may be low-pass filters which may have different time constants. The outputs of the comparators 43a-c are combined using, e.g. an OR-gate. A different logic operation may be used, e.g., when inverted logic levels are used. In the present example, the signal OC indicates an over-current state when the comparator of one of the three branches signals an over-current, which is assumed to be the case when $y_1[n] \geq dT_{R1}$ or $y_2[n] \geq dT_{R2}$ or $y_3[n] \geq dT_{R3}$ (i.e., when one of the three conditions is true).

Figure 15:
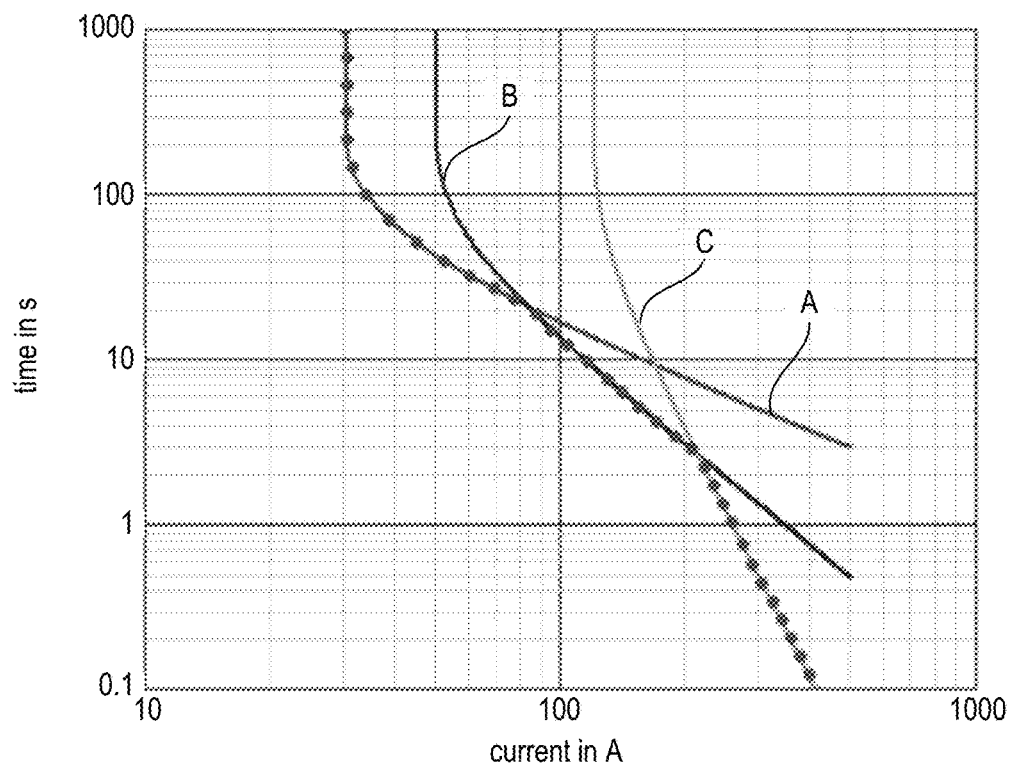
FIG. 15 illustrates one exemplary time-current characteristic for the circuit of FIG. 14.

It is understood that the concept for current monitoring may be extended by adding further branches. The diagram of FIG. 15 illustrates the effect of flexibly combining different time-current characteristics. Correspondingly with the example of FIG. 14, the diagram of FIG. 15 includes three time-current characteristics A-C which are associated with the three circuit branches of the circuit of FIG. 15, particularly with the filter characteristics of filter 42a-c and the thresholds used by comparators 43a-c. These time-current characteristics A, B, and C are combined in such a way that, for any current value, the minimum of the time values is taken, that result from the three curves.

Some embodiments may achieve a more flexible "design" of a time-current characteristic, so that an electronic fuse is not only capable of protecting a cable but can advantageously also be individually adjusted to a particular load (or type of load) supplied via the electronic fuse.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although various embodiments have been illustrated and described with respect to one or more specific implementations, alterations and/or modifications may be made to the illustrated examples without departing from the spirit and scope of the appended claims. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the invention.

It will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current monitoring circuit comprising:
   two or more signal branches, each signal branch comprising:
      a signal shaping circuit configured to receive a current sense signal and provide a modified current signal;
      a filter configured to receive the modified current signal and to provide a respective filtered signal;
      a comparator configured to receive the respective filtered signal and a respective threshold value and to provide a respective logic signal that indicates when the respective filtered signal exceeds the respective threshold value; and
      a logic circuit configured to combine the respective logic signals of the two or more signal branches, wherein the signal shaping circuit of each signal branch is configured to calculate a level of its respective modified current signal from a corresponding level of the current sense signal in accordance with a non-linear function.

2. The current monitoring circuit of claim 1, further comprising an analog-to-digital converter configured to digitize the current sense signal to form a digitized current sense signal, wherein the signal shaping circuit of each signal branch configured to receive the digitized current sense signal.

3. The current monitoring circuit of claim 1, wherein:
   the non-linear function is a polynomial function with an order higher than two;
   the non-linear function is a piecewise-linear function; or
   the non-linear function is implemented using a look-up table.

4. The current monitoring circuit of claim 3, wherein the signal shaping circuit of each signal branch comprises the look-up table, wherein the look-up table comprises:
   a plurality of comparators configured to provide a specific first output level as an output signal when the current sense signal is below a respective comparator threshold value and configured to provide a specific second output level as the output signal when the current sense signal is not below the respective threshold value;
a plurality of gain stages, wherein each of the plurality of gain stages is coupled downstream of a respective one of the plurality of comparators and configured to amplify the output signal of the respective one of the plurality of comparators by a respective scaling factor to form a respective scaled output level, wherein each respective comparator threshold and each respective scaling factor is stored in the look-up table; and
a summing circuit configured to provide a sum of each respective scaled output level.

5. The current monitoring circuit of claim 1, wherein the respective threshold value of each comparator is set according to a wire parameter.

6. An electronic switching system comprising:
the current monitoring circuit of claim 1; and
a transistor configured to provide the current sense signal.

7. A current monitoring circuit comprising:
a signal shaping circuit configured to receive a current sense signal and provide a modified current signal, wherein the signal shaping circuit comprises a look-up table, and the look-up table comprises:
a plurality of comparators configured to provide a specific first output level as an output signal when the current sense signal is below a respective comparator threshold value and configured to provide a specific second output level as the output signal when the current sense signal is not below the threshold value,
a plurality of gain stages, wherein each of the plurality of gain stages is coupled downstream of a respective one of the plurality of comparators and configured to amplify the output signal of the respective one of the plurality of comparators by a respective scaling factor to form a respective scaled output level, wherein each respective comparator threshold and each respective scaling factor is stored in the look-up table, and
a summing circuit configured to provide a sum of each respective scaled output level;
a filter configured to receive the modified current signal and to provide a respective filtered signal; and
a comparator configured to receive the respective filtered signal and a threshold value and to indicate when the respective filtered signal exceeds the threshold value.

8. An electronic fuse circuit comprising:
the current monitoring circuit of claim 7, wherein the signal shaping circuit of the current monitoring circuit is configured to receive the current sense signal from a transistor;
a logic circuit having a first input coupled to an input pin of the electronic fuse circuit, and a second input coupled to the current monitoring circuit; and
a driver circuit having an input coupled to the logic circuit and an output configured to drive a control node of the transistor.

9. The electronic fuse circuit of claim 8, further comprising the transistor.

10. The electronic fuse circuit of claim 8, wherein the logic circuit is configured to cause the driver circuit to turn-off the transistor when the comparator of the current monitoring circuit indicates that the respective filtered signal exceeds the threshold value.

11. The current monitoring circuit of claim 7, further comprising:
at least one further signal shaping circuit configured to receive the current sense signal and provide a respective modified current signal;
at least one further filter coupled downstream of the at least one further signal shaping circuit and configured to receive the modified current signal of the at least one further signal shaping circuit and to provide a further respective filtered signal;
at least one further comparator configured to receive the further respective filtered signal of the at least one further filter and a corresponding digital threshold value and to signal when the further respective filtered signal of the at least one further filter exceeds the corresponding digital threshold value; and
a logic circuit coupled to an output of the comparator and to an output of the at least one further comparator and configured to indicate when the comparator indicates that the threshold value is exceeded or the at least one further comparator indicates that the corresponding digital threshold value is exceeded.

12. A smart electronic switch comprising:
the current monitoring circuit of claim 11;
a transistor having a load current path coupled between a supply terminal and an output terminal;
a control circuit configured to generate a drive signal for switching the transistor on and off; and
a current sense circuit configured to generate the current sense signal, which represents a load current of the transistor, wherein the control circuit is configured to trigger a switch-off of the transistor in response to the comparator of the current monitoring circuit indicating that the respective filtered signal exceeds the corresponding digital threshold value.

13. The current monitoring circuit of claim 7, wherein the respective scaling factor or the respective comparator threshold is programmable.

14. The current monitoring circuit of claim 7, wherein the respective scaling factor or the respective comparator threshold is set according to at least one wire parameter.

* * * * *